United States Patent
Ho et al.

(10) Patent No.: US 10,815,392 B2
(45) Date of Patent: Oct. 27, 2020

(54) CHEMICAL MECHANICAL POLISHING METHOD FOR TUNGSTEN

(71) Applicant: Rohm and Haas Electronic Materials CMP Holdings, Inc., Newark, DE (US)

(72) Inventors: Lin-Chen Ho, Taichung (TW); Wei-Wen Tsai, Philadelphia, PA (US)

(73) Assignee: ROHM AND HAAS ELECTRONIC CMP HOLDINGS, INC., Newark, DE (US)

( * ) Notice: Subject to any disclaimer, the term of this patent is extended or adjusted under 35 U.S.C. 154(b) by 0 days.

(21) Appl. No.: 16/290,929

(22) Filed: Mar. 3, 2019

(65) Prior Publication Data

US 2019/0338163 A1 Nov. 7, 2019

Related U.S. Application Data

(60) Provisional application No. 62/666,251, filed on May 3, 2018.

(51) Int. Cl.
| | |
|---|---|
| *H01L 21/302* | (2006.01) |
| *H01L 21/461* | (2006.01) |
| *C09G 1/02* | (2006.01) |
| *H01L 21/768* | (2006.01) |
| *H01L 21/321* | (2006.01) |

(52) U.S. Cl.
CPC ............ *C09G 1/02* (2013.01); *H01L 21/3212* (2013.01); *H01L 21/7684* (2013.01)

(58) Field of Classification Search
None
See application file for complete search history.

(56) References Cited

U.S. PATENT DOCUMENTS

| | | | |
|---|---|---|---|
| 7,004,819 B2 | 2/2006 | Moeggenborg et al. | |
| 7,247,567 B2 | 7/2007 | Vacassy et al. | |
| 9,566,686 B2 | 2/2017 | Grumbine et al. | |
| 2005/0173669 A1 | 8/2005 | Kurata et al. | |
| 2007/0157524 A1* | 7/2007 | Lortz | C09G 1/02 51/298 |
| 2010/0301265 A1 | 12/2010 | Kurata et al. | |
| 2013/0327977 A1* | 12/2013 | Singh | C09G 1/02 252/79.1 |
| 2014/0094033 A1* | 4/2014 | Yamato | H01L 21/31053 438/693 |
| 2014/0349484 A1* | 11/2014 | Yokota | H01L 21/3212 438/693 |
| 2015/0132955 A1* | 5/2015 | Yamato | C09K 3/1463 438/692 |
| 2016/0237315 A1 | 8/2016 | Stender et al. | |
| 2017/0081553 A1* | 3/2017 | Tamada | H01L 21/30625 |
| 2017/0121560 A1* | 5/2017 | Dockery | B24B 37/24 |

* cited by examiner

*Primary Examiner* — Shamim Ahmed
(74) *Attorney, Agent, or Firm* — John J. Piskorski

(57) ABSTRACT

A process for chemical mechanical polishing a substrate containing tungsten is disclosed to reduce corrosion rate and inhibit dishing of the tungsten and erosion of underlying dielectrics. The process includes providing a substrate; providing a polishing composition, containing, as initial components: water; an oxidizing agent; nonionic polyacrylamide; a dicarboxylic acid, a source of iron ions; a colloidal silica abrasive having a negative zeta potential; and, optionally, a pH adjusting agent; providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the tungsten is polished away from the substrate, corrosion rate is reduced, dishing of the tungsten is inhibited as well as erosion of dielectrics underlying the tungsten.

8 Claims, No Drawings

CHEMICAL MECHANICAL POLISHING METHOD FOR TUNGSTEN

This application claims priority to U.S. Provisional Application No. 62/666,251, filed on May 3, 2018, which is incorporated herein by reference in its entirety.

FIELD OF THE INVENTION

The present invention is directed to the field of chemical mechanical polishing of tungsten to inhibit dishing of the tungsten in combination with inhibiting erosion of underlying dielectrics and also to reduce corrosion rate of tungsten. More specifically, the present invention is directed to a method for chemical mechanical polishing of tungsten to inhibit dishing of the tungsten in combination with inhibiting erosion of underlying dielectrics and also to reduce corrosion rate of tungsten by providing a substrate containing tungsten; providing a polishing composition, containing, as initial components: water; an oxidizing agent; nonionic polyacrylamide; a dicarboxylic acid, a source of iron ions; a negatively charged colloidal silica abrasive; and, optionally, a pH adjusting agent; providing a chemical mechanical polishing pad, having a polishing surface; creating dynamic contact at an interface between the polishing pad and the substrate; and dispensing the polishing composition onto the polishing surface at or near the interface between the polishing pad and the substrate where some of the tungsten is polished away from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a particular material.

Chemical mechanical polishing has become a preferred method for polishing tungsten during the formation of tungsten interconnects and contact plugs in integrated circuit designs. Tungsten is frequently used in integrated circuit designs for contact/via plugs. Typically, a contact or via hole is formed through a dielectric layer on a substrate to expose regions of an underlying component, for example, a first level metallization or interconnect. Tungsten is a hard metal and tungsten CMP runs at relatively aggressive settings which poses unique challenges for tungsten CMP. Unfortunately, many CMP slurries used to polish tungsten because of their aggressive nature cause the problem of over-polishing and dishing resulting in non-uniform or nonplanar surfaces. The term "dishing" refers to excessive (unwanted) removal of metal, such as tungsten, from metal interconnect precursors and other features on semiconductors during CMP, thereby causing unwanted cavities in the tungsten. Dishing is undesirable since, in addition to causing nonplanar surfaces, it negatively affects the electrical performance of the semiconductor. The severity of the dishing can vary but it typically is severe enough to cause erosion of underlying dielectric materials, such as silicon dioxide (TEOS). Erosion is undesirable since the dielectric layer should ideally be flawless and free of cavities to endure optimal electrical performance of the semiconductor.

The topographical defects which can result from such dishing and erosion can further lead to non-uniform removal of additional materials from the substrate surface, such as barrier layer material disposed beneath the conductive material or dielectric material and produce a substrate surface having less than desirable quality which can negatively impact the performance of integrated circuits of the semiconductor. In addition, as features on the surface of semiconductors become more and more miniaturized, it becomes increasingly difficult to successfully polish the surfaces of the semiconductors.

Another problem associated with polishing tungsten is corrosion. The corrosion of tungsten is a common side-effect of CMP. During the CMP process the tungsten polishing slurry that remains on the surface of the substrate continues to corrode the tungsten and substrate beyond the effects of the CMP. Sometimes corrosion is desired; however, in most semiconductor processes corrosion is to be reduced or inhibited.

Therefore, there is a need for a CMP polishing method and composition for tungsten which inhibits dishing and corrosion of tungsten and erosion of underlying dielectric materials, such as TEOS.

SUMMARY OF THE INVENTION

The present invention provides a method of chemical mechanical polishing tungsten, comprising: providing a substrate comprising tungsten and a dielectric; providing a chemical mechanical polishing composition, comprising, as initial components: water; an oxidizing agent; nonionic polyacrylamide; a colloidal silica abrasive having a negative zeta potential; a dicarboxylic acid, salt thereof or mixtures thereof; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the tungsten.

The present invention provides a chemical mechanical method of polishing tungsten, comprising: providing a substrate comprising tungsten and a dielectric; providing a chemical mechanical polishing composition, comprising, as initial components: water; an oxidizing agent; nonionic polyacrylamide; a colloidal silica abrasive having a negative zeta potential; a dicarboxylic acid, salt thereof or mixtures thereof; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove some of the tungsten from the substrate; wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The present invention provides a chemical mechanical method of polishing tungsten, comprising: providing a substrate comprising tungsten and a dielectric; providing a chemical mechanical polishing composition, comprising, as initial components: water; an oxidizing agent; nonionic polyacrylamide in amounts of 20 ppm to 320 ppm; a colloidal silica abrasive having a negative zeta potential; a dicarboxylic acid selected from the group consisting of malonic acid, oxalic acid, maleic acid, malic acid, tartaric acid, salts thereof and mixtures thereof; a source of iron (III) ions; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove some of the tungsten from the substrate; wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; wherein the chemical mechanical polishing pad comprises a polyurethane polishing layer containing polymeric hollow core microparticles and a polyurethane impregnated non-woven subpad.

The present invention provides a method of chemical mechanical polishing tungsten, comprising: providing the substrate comprising tungsten and a dielectric; providing a chemical mechanical polishing composition, comprising, as initial components: water; 0.01 to 10 wt % of an oxidizing agent, wherein the oxidizing agent is hydrogen peroxide; 50 ppm to 320 ppm of nonionic polyacrylamide; 0.01 to 10 wt % of a colloidal silica abrasive having a negative zeta potential; 100 to 1,400 ppm malonic acid, salts thereof or mixtures thereof; 100 to 1,000 ppm of a source of iron (III) ions, wherein the source of iron (III) ions is ferric nitrate nonahydrate; and, optionally, a pH adjusting agent; wherein the chemical mechanical polishing composition has a pH of 1 to 7; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove some of the tungsten from the substrate.

The present invention provides a method of chemical mechanical polishing tungsten, comprising: providing a substrate comprising tungsten and a dielectric; providing a chemical mechanical polishing composition, comprising, as initial components: water; 1 to 3 wt % of an oxidizing agent, wherein the oxidizing agent is hydrogen peroxide; 80 to 320 ppm of nonionic polyacrylamide; 0.2 to 2 wt % of a colloidal silica abrasive having a negative zeta potential; 120 to 1,350 ppm of malonic acid, salts thereof, or mixtures thereof; 250 to 400 ppm of a source of iron (III) ions, wherein the source of iron (III) ions is ferric nitrate nonahydrate; and, optionally, a pH adjusting agent; wherein the chemical mechanical polishing composition has a pH of 2 to 2.5; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove some of the tungsten from the substrate.

The present invention also provides for a composition for chemical mechanical polishing tungsten comprising, as initial components:
water;
an oxidizing agent;
nonionic polyacrylamide
a colloidal silica abrasive having a negative zeta potential;
a dicarboxylic acid, salt thereof or mixtures thereof;
a source of iron (III) ions; and,
optionally, a pH adjusting agent.

The present invention further provides a chemical mechanical polishing composition for tungsten comprising, as initial components:
the water;
0.01 to 10 wt % of an oxidizing agent, wherein the oxidizing agent is hydrogen peroxide;
20 to 320 ppm of a nonionic polyacrylamide;
0.01 to 10 wt % of a colloidal silica abrasive having a negative zeta potential;
100 to 1,400 ppm of malonic acid, salts thereof or mixtures thereof;
100 to 1,000 ppm of a source of iron (III) ions, wherein the source of iron (III) ions is ferric nitrate nonahydrate;
optionally the pH adjusting agent, and
wherein the chemical mechanical polishing composition has a pH from 1 to 7.

The foregoing methods and compositions of the present invention use a chemical mechanical polishing composition comprising nonionic polyacrylamide which polishes tungsten and inhibits dishing of the tungsten in combination with inhibiting erosion of underlying dielectrics and also reduces corrosion rate of the tungsten.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; μ=μm=microns; kPa=kilopascal; A=angstroms; mV=millivolts; DI=deionized; ppm=parts per million=mg/L; mm=millimeters; cm=centimeter; min=minute; rpm=revolutions per minute; lbs=pounds; kg=kilograms; W=tungsten; PO=propylene oxide; EO=ethylene oxide; ICP-OES=inductively coupled plasma optical emission spectroscopy; wt %=percent by weight; PS=polishing slurry of the invention; CS=control slurry; CPS=comparative polishing slurry; and RR=removal rate.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "amide" means an organic compound derived from an acid with a general formula R—CO—NH$_2$, wherein R is an alkyl group, or alkylene (alkanediyl) group. The term "alkyl group" means an organic functional group or moiety that contains only carbon and hydrogen arranged in a chain and has a general formula C$_n$H$_{2n+1}$, wherein "n" is an integer of 1 or greater, e.g. CH$_3$ and C$_2$H$_5$. The term "alkylene (alkanediyl) group" means a bivalent saturated organic radical derived from an alkene by opening the double bond, or from an alkane by removal of two hydrogen atoms from different carbon atoms, e.g. ethylene. The term "amine" means an organic compound derived from ammonia characterized by nitrogen joined to at least one alkyl group. The term "amino acid" means an organic compound having a basic amino group (NH$_2$) and an acidic carboxyl group (COOH) joined to the same carbon atom. The term "moiety" means a part or functional group of a molecule. The term "nonionic" means not dissociating into ions in aqueous solution, i.e. neutral. The term "TEOS" means the silicon dioxide formed from the decomposition of tetraethyl orthosilicate (Si(OC$_2$H$_5$)$_4$). The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing a substrate of the present invention uses a chemical mechanical polishing composition containing an oxidizing agent; a nonionic polyacrylamide; a colloidal silica abrasive having a negative zeta potential; a dicarboxylic acid or salt thereof; a source of iron (III) ions; and, optionally, a pH adjusting agent to provide for the combination of removal of tungsten from the substrate surface while inhibiting dishing of the tungsten and corrosion rate of the tungsten and erosion of underlying dielectric materials, such as TEOS.

Preferably, the nonionic polyacrylamide of the present invention is water-soluble and has a general formula (I) with the repeating moiety disclosed below:

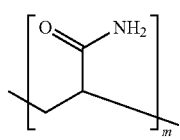

(I)

wherein m is a number such that the weight average molecular weight of the nonionic water soluble polyacrylamide is from 500 to 6,000,000 g/mole, preferably, from 600 to 5,000,000 g/mole, more preferably from 600 to 400,000 g/mole, even more preferably, from 1000 to 100,000 g/mole, and, most preferably from 5,000 to 15,000 g/mole.

Preferably, the method of polishing a substrate of the present invention, comprises: providing the substrate, wherein the substrate comprises tungsten and a dielectric; providing a chemical mechanical polishing composition, comprising, (more preferably, consisting of), as initial components: water; an oxidizing agent, preferably, in amounts of at least 0.01 wt % to 10 wt %, more preferably, in amounts of 0.1 wt % to 5 wt %, still more preferably, from 1 wt % to 3 wt %; a nonionic polyacrylamide in amounts of at least 20 ppm, preferably, 20 ppm to 320 ppm, more preferably, from 50 ppm to 320 ppm, still more preferably, from 80 ppm to 320 ppm, most preferably from 200 ppm to 320 ppm; a colloidal silica abrasive having a negative zeta potential, preferably, in amounts of 0.01 wt % to 10 wt %, more preferably, from 0.05 wt % to 7.5 wt %, even more preferably, from 0.1 wt % to 5 wt %, most preferably, from 0.2 wt % to 2 wt %; a dicarboxylic acid, salt thereof or mixtures thereof, preferably, in amounts of 100 ppm to 1400 ppm, more preferably, from 120 ppm to 1350 ppm; a source of iron (III) ions, preferably, wherein the source of iron (III) ions is ferric nitrate nonahydrate; and, optionally, a pH adjusting agent; preferably, wherein the chemical mechanical polishing composition has a pH of 1 to 7; preferably, of 1.5 to 4.5; more preferably, 1.5 to 3.5; still more preferably, of 2 to 2.5; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the tungsten is polished away from the substrate.

Preferably, in the method of polishing a substrate of the present invention, the substrate comprises tungsten and a dielectric. More preferably, the substrate provided is a semiconductor substrate comprising tungsten and a dielectric. Most preferably, the substrate provided is a semiconductor substrate comprising tungsten deposited within at least one of holes and trenches formed in a dielectric, such as TEOS.

Preferably, in the method of polishing a substrate of the present invention, the water contained, as an initial component, in the chemical mechanical polishing composition provided is at least one of deionized and distilled to limit incidental impurities.

It is preferred in the method of chemical mechanical polishing a substrate of the present invention with the chemical mechanical polishing composition of the present invention, the chemical mechanical polishing composition excludes amino acids and conventional anticorrosion agents, including, but not limited to, heterocyclic nitrogen compounds, for example, triazoles, imidazoles, pyrazoles, benzimidazoles and benzotriazoles; and compounds such as, for example, polyethylene glycols and polyethylene oxides.

Preferably, in the method of polishing a substrate of the present invention, the chemical mechanical polishing composition provided contains, as an initial component, an oxidizing agent, wherein the oxidizing agent is selected from the group consisting of hydrogen peroxide (H$_2$O$_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains, as an initial component, 0.01 to 10 wt %, more preferably, 0.1 to 5 wt %; most preferably, 1 to 3 wt % of an oxidizing agent.

Preferably, in the method of polishing a substrate of the present invention, the chemical mechanical polishing composition provided contains, as an initial component, a source of iron (III) ions. More preferably, in the method of the present invention, the chemical mechanical polishing composition provided contains, as an initial component, a source of iron (III) ions, wherein the source of iron (III) ions is selected from the group consisting iron (III) salts. Most preferably, in the method of the present invention, the chemical mechanical polishing composition provided contains, as an initial component, a source of iron (III) ions, wherein the source of iron (III) ions is ferric nitrate nonahydrate, $(Fe(NO_3)_3 \cdot 9H_2O)$.

Preferably, in the method of polishing a substrate of the present invention, the chemical mechanical polishing composition provided contains, as an initial component, a source of iron (III) ions sufficient to introduce 1 to 200 ppm, preferably, 5 to 150 ppm, more preferably, 7.5 to 125 ppm, most preferably, 10 to 100 ppm of iron (III) ions to the chemical mechanical polishing composition.

Preferably, in the method of polishing a substrate of the present invention, the chemical mechanical polishing composition provided contains, as an initial component, a source of iron (III) ions. More preferably, in the method of polishing a substrate of the present invention, the chemical mechanical polishing composition provided contains, as an initial component, 100 to 1,000 ppm, preferably, 150 to 750 ppm, more preferably, 200 to 500 ppm and most preferably, 250 to 400 ppm of a source of iron (III) ions. Most preferably, in the method of polishing a substrate of the present invention, the chemical mechanical polishing composition provided contains, as an initial component, 100 to 1,000 ppm, preferably, 150 to 750 ppm, more preferably, 200 to 500 ppm, most preferably, 250 to 400 ppm of a source of iron (III) ions, wherein the source of iron (III) ions is ferric nitrate nonahydrate, $(Fe(NO_3)_3 \cdot 9H_2O)$.

Preferably, in the method of polishing a substrate of the present invention, the chemical mechanical polishing composition provided contains, as an initial component, nonionic, water-soluble polyacrylamide having the general formula (I), disclosed above, wherein the nonionic, water-soluble polyacrylamide is included in amounts of at least 20 ppm, preferably, 20 ppm to 320 ppm, more preferably, from 50 ppm to 320 ppm, still more preferably, from 80 ppm to 320 ppm, and, most preferably, from 250 ppm to 320 ppm.

In the method of polishing a substrate of the present invention, the chemical mechanical polishing composition provided contains a colloidal silica abrasive having a negative zeta potential. Preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 2.5; and, most preferably from 2 to 2.3. Still more preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 2.5; and, most preferably, of 2 to 2.3 as indicated by a zeta potential from −0.1 mV to −20 mV.

Preferably, in the method of polishing a substrate of the present invention, the chemical mechanical polishing composition provided contains, as an initial component, a colloidal silica abrasive having a negative zeta potential, wherein the colloidal silica abrasive has an average particle size≤100 nm, preferably, 5 to 100 nm; more preferably, 10 to 60 nm; most preferably, 20 to 60 nm as measured by dynamic light scattering techniques.

Preferably, in the method of polishing a substrate of the present invention, the chemical mechanical polishing composition provided contains 0.01 to 10 wt %, preferably, 0.05 to 7.5 wt %, more preferably, 0.1 to 5 wt %, most preferably, 0.2 to 2 wt % of a colloidal silica abrasive having a negative zeta potential.

Preferably, in the method of polishing a substrate of the present invention, the chemical mechanical polishing composition provided contains, as an initial component, a dicarboxylic acid, wherein the dicarboxylic acid includes, but is not limited to, malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, a dicarboxylic acid, wherein the dicarboxylic acid is selected from the group consisting of malonic acid, oxalic acid, malic acid, maleic acid, tartaric acid, salts thereof and mixtures thereof. Still more preferably, the chemical mechanical polishing composition provided contains, as an initial component, a dicarboxylic acid, wherein the dicarboxylic acid is selected from the group consisting of malonic acid, oxalic acid, salts thereof and mixtures thereof. Most preferably, in the method of polishing a substrate of the present invention, the chemical mechanical polishing composition provided contains, as an initial component, the dicarboxylic acid malonic acid, salts thereof or mixtures thereof.

Preferably, in the method of polishing a substrate of the present invention, the chemical mechanical polishing composition provided contains, as an initial component, 1 to 2,600 ppm, preferably, 100 to 1,400 ppm, more preferably, 120 to 1,350 ppm, still more preferably, 1,000 to 1,320 ppm, of a dicarboxylic acid, wherein the dicarboxylic acid includes, but is not limited to, malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, 1 to 2,600 ppm of malonic acid, oxalic acid, salts thereof or mixtures thereof. Most preferably, in the method of polishing a substrate of the present invention, the chemical mechanical polishing composition provided contains, as an initial component 100 to 1,400 ppm, more preferably, 120 to 1,350 ppm, still more preferably, 1,000 to 1,320 ppm, the dicarboxylic acid malonic acid, salts thereof or mixtures thereof.

Preferably, in the method of polishing a substrate of the present invention, the chemical mechanical polishing composition provided has a pH of 1 to 7. More preferably, in the method of polishing a substrate of the present invention, the chemical mechanical polishing composition provided has a pH of 1.5 to 4.5. Still more preferably, in the method of polishing a substrate of the present invention, the chemical mechanical polishing composition provided has a pH of 1.5 to 3.5. Further preferably, in the method of polishing a substrate of the present invention, the chemical mechanical polishing composition provided has a pH of 2 to 2.5, and, most preferably, the chemical mechanical polishing composition of the present invention has a pH form 2 to 2.3.

Optionally, but preferably, in the method of polishing a substrate of the present invention, the chemical mechanical polishing composition provided contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Preferably, in the method of polishing a substrate of the present invention, the chemical mechanical polishing pad provided can by any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

Preferably, in the method of polishing a substrate of the present invention, the chemical mechanical polishing composition provided has a tungsten removal rate $\geq 1,000$ Å/min; preferably, $\geq 1,500$ Å/min; more preferably, $\geq 2,000$ Å/min. More preferably, in the method of polishing a substrate of the present invention, the chemical mechanical polishing composition provided has a tungsten removal rate of $\geq 1,000$ Å/min; preferably, $\geq 1,500$ Å/min; more preferably, $\geq 2,000$ Å/min; and with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

As is illustrated in the following Examples the nonionic polyacrylamide CMP methods of the present invention inhibit tungsten dishing in combination with inhibiting erosion of underlying TEOS and further inhibit tungsten corrosion rate.

Example 1

Slurry Formulations

The chemical mechanical polishing compositions of this Example were prepared by combining the components in the amounts listed in Table 1 with the balance being DI water and adjusting the pH of the compositions to the final pH listed in Table 1 with 45 wt % potassium hydroxide.

TABLE 1

| Slurry # | Abrasive[1] (wt %) | Nonionic Polyacrylamide[2] (ppm) | $Fe(NO_3)_3$ (ppm) | Malonic Acid (ppm) | $H_2O_2$ (wt %) | pH |
|---|---|---|---|---|---|---|
| CS-1 | 2 | — | 362 | 1320 | 2 | 2.3 |
| PS-1 | 2 | 20 | 362 | 1320 | 2 | 2.3 |
| PS-2 | 2 | 50 | 362 | 1320 | 2 | 2.3 |
| PS-3 | 2 | 80 | 362 | 1320 | 2 | 2.3 |
| PS-4 | 2 | 160 | 362 | 1320 | 2 | 2.3 |
| PS-5 | 2 | 320 | 362 | 1320 | 2 | 2.3 |
| PS-6 | 2 | 320 | 362 | 1320 | 3 | 2.3 |

[1]KLEBOSOL ™ 1598-B25 (−) zeta potential abrasive slurry manufactured by AZ Electronics Materials, available from The Dow Chemical Company;
[2]Weight average molecular weight = 10,000 g/mole.

Example 2

Corrosion Rate Performance of Polysaccharide CMP Slurries

The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 $cm^2$. The results of the corrosion tests are in Table 2.

TABLE 2

| Slurry # | W Corrosion Rate (Å/min) |
|---|---|
| CS-1 | 25 |
| PS-1 | 22 |
| PS-3 | 17 |
| PS-4 | 8.9 |
| PS-5 | 3.7 |

The results of the static corrosion rate tests showed that the chemical mechanical polishing slurries containing nonionic polyacrylamide effectively reduced the static corrosion on W containing wafers better than the control slurry (CS-1) which excluded nonionic polyacrylamide.

Example 3

Chemical Mechanical Polishing—Dishing and Erosion Performance of Nonionic Polyacrylamide and Negative Zeta Potential CMP Slurries The polishing experiments were performed on 200 mm blanket wafers installed on an Applied Materials 200 mm MIRRA® polishing machine. The polishing removal rate experiments were performed on 200 mm blanket 15 kÅ-thick TEOS sheet wafers plus W, Ti, and TiN blanket wafers available from Silicon Valley Microelectronics. All polishing experiments were performed using an IC1010™ polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 125 mL/min, a table rotation speed of 80 rpm and a carrier rotation speed of 81 rpm unless specified otherwise. A Kinik PDA33A-3 diamond pad conditioner (commercially available from Kinik Company) was used to dress the polishing pad. The polishing pad was broken in with the conditioner using a down force of 9.0 lbs (4.1 kg) for 15 minutes and 7.0 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The TEOS erosion depths were determined by measuring the film thickness before and after polishing using a KLA-Tencor FX200 metrology tool. The W removal and dishing rates were determined using a KLA-Tencor RS100C metrology tool. The wafers had varying standard line width features as shown in Table 3. In the tables of this example the numerator refers to W and the denominator refers to TEOS.

TABLE 3

| | 10/10 µm | | 0.25/0.25 µm | |
|---|---|---|---|---|
| Slurry # | Dishing (Å) | Erosion (Å) | Dishing (Å) | Erosion (Å) |
| CS-1 | 632 | 163 | 166 | 211 |
| PS-1 | 506 | 144 | 61 | 222 |
| PS-2 | 354 | 80 | 21 | 175 |
| PS-3 | 351 | 86 | 47 | 160 |
| PS-4 | 290 | 169 | 55 | 181 |
| PS-5 | 228 | 93 | 50 | 128 |
| PS-6 | 251 | 84 | 11 | 95 |

Overall the slurries which included nonionic polyacrylamide showed improved performance over the slurry which excluded nonionic polyacrylamide. The nonionic polyacrylamide slurries showed overall reduced dishing of W and reduced erosion of TEOS.

Example 4

Comparative Slurry Formulations

The chemical mechanical polishing compositions of this Example were prepared by combining the components in the amounts listed in Table 4 with the balance being DI water and adjusting the pH of the compositions to the final pH listed in Table 4 with 45 wt % potassium hydroxide.

TABLE 4

| Slurry# | Abrasive[3] (wt %) | Nonionic Polyacrylamide[4] (ppm) | Fe(NO$_3$)$_3$ (ppm) | Malonic Acid (ppm) | H$_2$O$_2$ (wt %) | pH |
|---|---|---|---|---|---|---|
| CS-2 | 0.6 | — | 362 | 1320 | 2 | 2.3 |
| CPS-1 | 0.6 | 50 | 362 | 1320 | 2 | 2.3 |
| CPS-2 | 0.6 | 300 | 362 | 1320 | 2 | 2.3 |

[3]FUSO HL-3 (+) zeta potential abrasive slurry manufactured by Fuso Chemical Company, LTD;
[4]Weight average molecular weight = 10,000 g/mole.

Example 5

Chemical Mechanical Polishing—Comparative Dishing and Erosion Performance of Nonionic Polyacrylamide and Positive Zeta Potential Abrasives CMP Slurries The chemical mechanical polishing procedures and parameters as described in Example 3 above were repeated with the comparative chemical mechanical polishing slurries disclosed in Example 4, Table 4 above. The results are disclosed in Table 5.

TABLE 5

| | 10/10 µm | | 0.25/0.25 µm | |
|---|---|---|---|---|
| Slurry # | Dishing (Å) | Erosion (Å) | Dishing (Å) | Erosion (Å) |
| CS-2 | 815 | 565 | 151 | 907 |
| CPS-1 | 503 | 609 | 57 | 1044 |
| CPS-2 | 373 | 672 | 38 | 1223 |

Although the slurries which included the positively charged silica abrasives in combination with the polyacrylamide showed improved dishing inhibition, the erosion was far worse compared to the slurries in Example 3 which included to combination of nonionic polyacrylamide and the negatively charged silica abrasives. The erosion was particularly severe at the smaller 0.25/0.25 µm feature size.

Example 6

Comparative Slurry Formulations

The chemical mechanical polishing compositions of this Example were prepared by combining the components in the amounts listed in Table 6 with the balance being DI water and adjusting the pH of the compositions to the final pH listed in Table 6 with 45 wt % potassium hydroxide.

TABLE 6

| Slurry# | Abrasive[3] (wt %) | Nonionic Polyacrylamide[4] (ppm) | Fe(NO$_3$)$_3$ (ppm) | Malonic Acid (ppm) | H$_2$O$_2$ (wt %) | pH |
|---|---|---|---|---|---|---|
| CS-2 | 0.6 | — | 362 | 1320 | 2 | 2.3 |
| CPS-3 | 0.6 | 20 | 362 | 1320 | 2 | 2.3 |
| CPS-4 | 0.6 | 80 | 362 | 1320 | 2 | 2.3 |
| CPS-5 | 0.6 | 160 | 362 | 1320 | 2 | 2.3 |

[3]FUSO HL-3 (+) zeta potential abrasive slurry manufactured by Fuso Chemical Company, LTD;
[4]Weight average molecular weight = 10,000 g/mole.

Example 7

Chemical Mechanical Polishing—Comparative Dishing and Erosion Performance of Nonionic Polyacrylamide and Positive Zeta Potential Abrasives CMP Slurries The chemical mechanical polishing procedures and parameters as described in Example 3 above were repeated with the comparative chemical mechanical polishing slurries disclosed in Example 6, Table 6 above. The results are disclosed in Table 7.

TABLE 7

| | 10/10 μm | | 0.25/0.25 μm | |
| --- | --- | --- | --- | --- |
| Slurry # | Dishing (Å) | Erosion (Å) | Dishing (Å) | Erosion (Å) |
| CS-2 | 815 | 565 | 151 | 907 |
| CPS-3 | 677 | 592 | 199 | 963 |
| CPS-4 | 704 | 660 | 205 | 1063 |
| CPS-5 | 715 | 610 | 206 | 1029 |

Although the slurries which included the positively charged silica abrasives in combination with the polyacrylamide showed some improved dishing inhibition at 10/10 μm, the dishing and erosion were far worse compared to the slurries in Example 3 which included the combination of nonionic polyacrylamide and the negatively charged silica abrasives. The dishing and erosion were particularly severe at the smaller 0.25/0.25 μm feature size. In contrast, the dishing and erosion performance of 0.25/0.25 μm in Example 3 showed a major improvement over the dishing and erosion results of comparative slurries CPS-3, CPS-4 and CPS-5.

What is claimed is:

1. A method of chemical mechanical polishing tungsten, comprising:
   providing a substrate comprising tungsten and a dielectric;
   providing a chemical mechanical polishing composition, consisting of, as initial components:
   water;
   an oxidizing agent;
   nonionic polyacrylamide;
   a colloidal silica abrasive having a negative zeta potential;
   a dicarboxylic acid,
   a source of iron (III) ions; and,
   optionally, a pH adjusting agent;
   providing a chemical mechanical polishing pad, having a polishing surface;
   creating dynamic contact at an interface between the chemical mechanical polishing pad and the substrate; and
   dispensing the chemical mechanical polishing composition onto the polishing surface of the chemical mechanical polishing pad at or near the interface between the chemical mechanical polishing pad and the substrate to remove at least some of the tungsten.

2. The method of claim 1, wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

3. The method of claim 1, wherein the chemical mechanical polishing composition, provided consists of, as initial components:
   the water;
   0.01 to 10 wt % of the oxidizing agent, wherein the oxidizing agent is hydrogen peroxide;
   20 to 320 ppm of the nonionic polyacrylamide;
   0.01 to 10 wt % of the colloidal silica abrasive having a negative zeta potential;
   1 to 2,600 ppm of the dicarboxylic acid selected from the group consisting of malonic acid, oxalic acid, maleic acid, malic acid, tartaric acid and salts thereof;
   100 to 1,000 ppm of the source of iron (III) ions, wherein the source of iron (III) ions is ferric nitrate nonahydrate; and,
   optionally, the pH adjusting agent; wherein the chemical mechanical polishing composition has a pH of 1 to 7.

4. The method of claim 3, wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

5. The method of claim 1, wherein the chemical mechanical polishing composition, provided consists of, as initial components:
   the water;
   0.01 to 10 wt % of the oxidizing agent, wherein the oxidizing agent is hydrogen peroxide;
   50 to 320 ppm of the nonionic polyacrylamide;
   0.01 to 10 wt % of the colloidal silica abrasive having a negative zeta potential;
   100 to 1,400 ppm of the dicarboxylic acid, wherein the dicarboxylic acid is malonic acid, salt thereof or mixtures thereof;
   100 to 1000 ppm of the source of iron (III) ions, wherein the source of iron (III) ions is ferric nitrate; and,
   optionally, the pH adjusting agent; wherein the chemical mechanical polishing composition has a pH of 1 to 7.

6. The method of claim 5, wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

7. The method of claim 1, wherein the chemical mechanical polishing composition, provided consists of, as initial components:
   the water;
   0.1 to 3 wt % of the oxidizing agent, wherein the oxidizing agent is hydrogen peroxide;
   80 to 320 ppm of the nonionic polyacrylamide;
   0.2 to 2 wt % of the colloidal silica abrasive having a negative zeta potential;
   120 to 1,350 ppm of the dicarboxylic acid, wherein the dicarboxylic acid is malonic acid, salt thereof or mixtures thereof;

250 to 500 ppm of the source of iron (III) ions, wherein the source of iron (III) ions is ferric nitrate; and, optionally, the pH adjusting agent; wherein the chemical mechanical polishing composition has a pH of 2 to 2.5.

8. The method of claim 7, wherein the chemical mechanical polishing composition provided has a tungsten removal rate of ≥1,000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

* * * * *